(12) United States Patent
Lee

(10) Patent No.: US 11,328,981 B2
(45) Date of Patent: May 10, 2022

(54) MEMORY DEVICE AND METHOD OF MANUFACTURING THE SAME

(71) Applicant: SK hynix Inc., Icheon-si (KR)

(72) Inventor: Nam Jae Lee, Icheon-si (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 0 days.

(21) Appl. No.: 17/075,503

(22) Filed: Oct. 20, 2020

(65) Prior Publication Data

US 2021/0375720 A1  Dec. 2, 2021

(30) Foreign Application Priority Data

May 28, 2020 (KR) .................. 10-2020-0064478

(51) Int. Cl.
*H01L 23/48* (2006.01)
*H01L 25/00* (2006.01)
*H01L 25/065* (2006.01)

(52) U.S. Cl.
CPC ........ *H01L 23/481* (2013.01); *H01L 25/0657* (2013.01); *H01L 25/50* (2013.01); *H01L 2225/06544* (2013.01)

(58) Field of Classification Search
CPC .............. H01L 23/481; H01L 25/0657; H01L 2225/06544
See application file for complete search history.

(56) References Cited

U.S. PATENT DOCUMENTS

| | | | |
|---|---|---|---|
| 9,214,374 B2 * | 12/2015 | Lee | H01L 23/481 |
| 2021/0217765 A1 * | 7/2021 | Kim | H01L 23/5226 |
| 2021/0225739 A1 * | 7/2021 | Yang | H01L 27/11582 |
| 2021/0272930 A1 * | 9/2021 | Choi | H01L 23/3128 |
| 2021/0305189 A1 * | 9/2021 | Jin | H01L 23/538 |
| 2021/0335800 A1 * | 10/2021 | Kim | H01L 27/11578 |
| 2021/0343230 A1 * | 11/2021 | Wang | G09G 3/32 |
| 2021/0366892 A1 * | 11/2021 | Kim | H01L 23/481 |
| 2021/0375720 A1 * | 12/2021 | Lee | H01L 25/0657 |

FOREIGN PATENT DOCUMENTS

| KR | 1020100048610 A | 5/2010 |
|---|---|---|
| KR | 1020120022142 A | 3/2012 |

* cited by examiner

*Primary Examiner* — Thao P Le
(74) *Attorney, Agent, or Firm* — William Park & Associates Ltd.

(57) ABSTRACT

The present disclosure includes a semiconductor device and a method of manufacturing the same. The semiconductor device includes a substrate including a first area and a second area, a vertical insulating film passing through the substrate between the first area of the substrate and the second area of the substrate, an interlayer insulating structure disposed on the substrate, and a conductive pad formed on the interlayer insulating structure and overlapping the first area of the substrate. The semiconductor device also includes a through electrode passing through the conductive pad, the interlayer insulating structure, and the substrate in the first area.

14 Claims, 15 Drawing Sheets

MEMORY DEVICE AND METHOD OF MANUFACTURING THE SAME

CROSS-REFERENCE TO RELATED APPLICATION

The present application claims priority under 35 U.S.C. § 119(a) to Korean patent application number 10-2020-0064478, filed on May 28, 2020, in the Korean Intellectual Property Office, the entire disclosure of which is incorporated herein by reference.

BACKGROUND

1. Technical Field

The present disclosure relates to a semiconductor device and a method of manufacturing the same, and more particularly, to a semiconductor device including a through electrode and a method of manufacturing the same.

2. Related Art

For high integration of a semiconductor device, a plurality of semiconductor chips may be vertically stacked. Through electrodes may pass through the semiconductor chips, respectively. The semiconductor chips may be electrically connected by connecting the through electrodes through a connection member such as a micro bump. The use of bumps, however, can result in increased thickness of a stacked multi-chip package.

SUMMARY

A semiconductor device according to an embodiment of the present disclosure may include a substrate including a first area and a second area, a vertical insulating film passing through the substrate between the first area of the substrate and the second area of the substrate, an interlayer insulating structure disposed on the substrate, and a conductive pad formed on the interlayer insulating structure and overlapping the first area of the substrate. The semiconductor device may also include a through electrode passing through the conductive pad, the interlayer insulating structure, and the substrate in the first area. A portion of the first area of the substrate may remain between the through electrode and the vertical insulating film to contact the through electrode.

A semiconductor device according to an embodiment of the present disclosure may include: a first semiconductor chip including a first substrate, a first interlayer insulating structure, and a first conductive pad, which are sequentially stacked; a second semiconductor chip overlapping the first semiconductor chip, wherein includes a second substrate, a second interlayer insulating structure, and a second conductive pad, which are sequentially stacked; a through electrode passing through the first semiconductor chip and the second semiconductor chip and contacting the first conductive pad, the second conductive pad, the first substrate, and the second substrate; a first vertical insulating film passing through the first substrate and spaced from a first contact surface between the first substrate and the through electrode; and a second vertical insulating film passing through the second substrate and spaced apart from a second contact surface between the second substrate and the through electrode.

A method of manufacturing a semiconductor device may include: forming a plurality of semiconductor chips, wherein each of the semiconductor chips includes an interlayer insulating structure and a conductive pad stacked on a substrate separated into a first area and a second area by a vertical insulating film; stacking the plurality of semiconductor chips; and forming a through electrode passing through the interlayer insulating structure, the conductive pad, and the first area of the substrate overlapping the conductive pad for each of the semiconductor chips, wherein the through electrode contacts the conductive pad and the first area of the substrate for each of the semiconductor chips.

DETAILED DESCRIPTION

Specific structural or functional descriptions disclosed herein are merely illustrative for the purpose of describing embodiments based on the concept of the present disclosure. Embodiments based on the concept of the present disclosure can be implemented in various forms and should not be construed as being limited to the specific embodiments set forth herein.

An embodiment of the present disclosure relates to a semiconductor device and a method of manufacturing the same.

Figure 1:
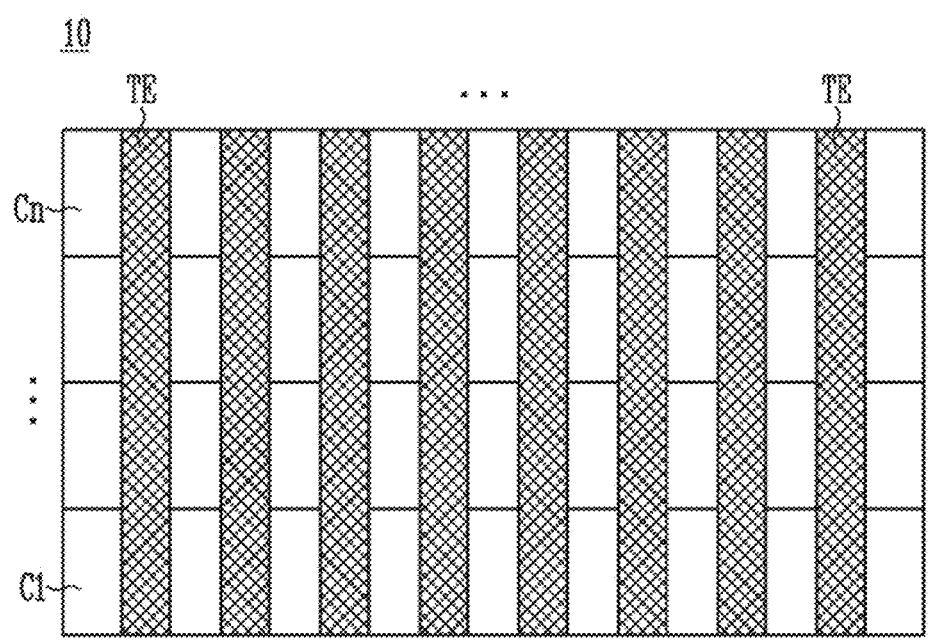
FIG. 1 is a cross-sectional view schematically illustrating a semiconductor device according to an embodiment of the present disclosure.

FIG. 1 is a cross-sectional view schematically illustrating a semiconductor device 10 according to an embodiment of the present disclosure. FIG. 1 is a cross-sectional view taken of a through via area in which a plurality of through electrodes TE are disposed in the semiconductor device 10.

Referring to FIG. 1, the semiconductor device 10 may include a plurality of semiconductor chips C1 to Cn (n is a natural number equal to or greater than 2). The semiconductor chips C1 to Cn may be stacked to overlap each other in a vertical direction.

The semiconductor chips C1 to Cn may be penetrated by the plurality of through electrodes TE. Each of the through electrodes TE may extend in the vertical direction, which is a stack direction of the semiconductor chips C1 to Cn, to pass through the plurality of semiconductor chips C1 to Cn.

The number and an arrangement of the plurality of through electrodes TE may be variously changed.

Through electrodes, that respectively pass through the plurality of semiconductor chips, may be arranged in a line to connect the through electrodes with a bonding medium such as a micro bump. In comparison with this, according to an embodiment of the present disclosure, because single through electrode TE extends to pass through the plurality of semiconductor chips C1 to Cn, a forming process of the through electrode may be simplified. Each of the through electrodes TE passing through the plurality of semiconductor chips C1 to Cn may be used as a data transmission path for transmitting a signal to the semiconductor chips C1 to Cn.

The semiconductor chips C1 to Cn may be homogeneous chips or heterogeneous chips. As an embodiment, each of the semiconductor chips C1 to Cn may be a memory chip. As another embodiment, at least one of the semiconductor chips C1 to Cn may be a logic chip including a peripheral circuit, and the others may be memory chips. As still another embodiment, at least one of the semiconductor chips C1 to Cn may be a logic chip, and the others may be pixel chips.

Figure 2:
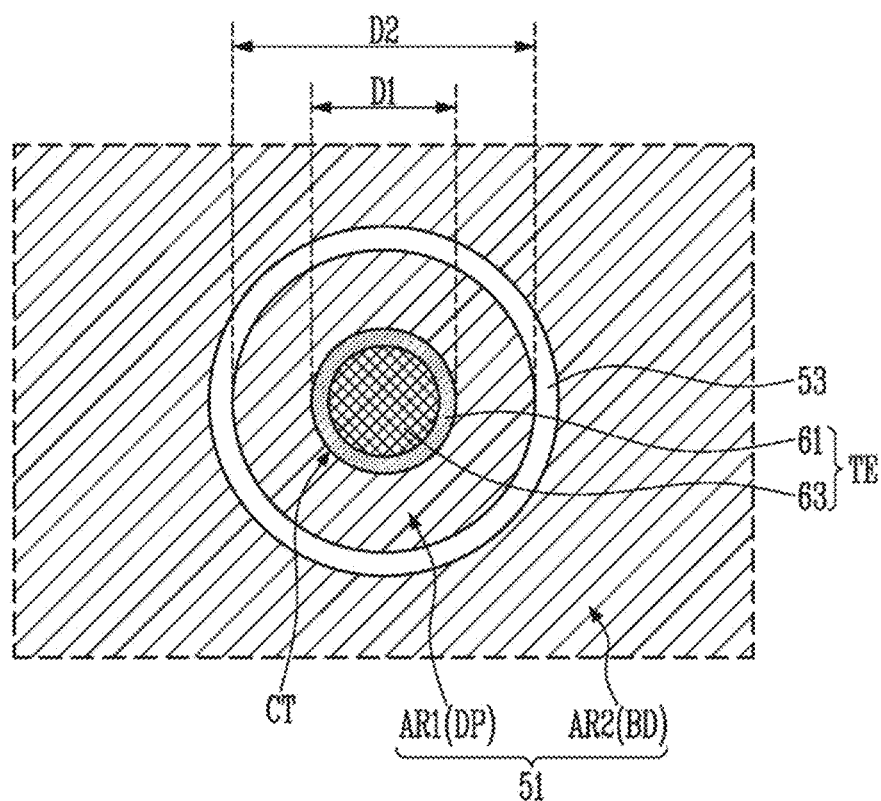
FIG. 2 is an enlarged view illustrating a cross-section of a through electrode according to an embodiment of the present disclosure.

FIG. 2 is an enlarged view illustrating a cross-section of the through electrode TE according to an embodiment of the present disclosure.

Referring to FIG. 2, the semiconductor device may include a substrate 51 of the semiconductor chip. The substrate 51 may be a semiconductor substrate of silicon, germanium, gallium arsenide, or the like.

The substrate 51 may include a first area AR1 and a second area AR2. The through electrode TE may pass through the first area AR1 of the substrate 51.

The substrate 51 may be penetrated by a vertical insulating film 53. The vertical insulating film 53 may be disposed between the first area AR1 and the second area AR2 and may insulate the first area AR1 from the second area AR2. The vertical insulating film 53 may be formed to surround a sidewall of the first area AR1. An outer shape of the first area AR1 defined along the sidewall of the first area AR1 may be variously changed, such as a circle, an ellipse, and a polygon. The vertical insulating film 53 may be formed as a closed curve or a polygon along the outer shape of the first area AR1. As an embodiment, the vertical insulating film 53 may surround the sidewall of the first area AR1 in a ring shape. The vertical insulating film 53 may be spaced apart from a contact surface CT between the through electrode TE and the first area AR1.

The first area AR1 remaining between the vertical insulating film 53 and the through electrode TE may be defined as a dummy pattern DP that is in contact with the through electrode TE.

In consideration of an alignment margin of the through electrode TE, an area of the first area AR1 defined by the vertical insulating film 53 may be formed to be wider than an area of the through electrode TE. Accordingly, an outer diameter D2 of the dummy pattern DP defined by the outer diameter of the first area AR1 may be formed to be greater than a diameter D1 of the through electrode TE.

The second area AR2 isolated from the first area AR1 by the vertical insulating film 53 may be defined as a body pattern BD including a well structure.

The through electrode TE may include a barrier film 61 and a metal film 63. The barrier film 61 may be formed of a single layer of titanium, titanium nitride, tantalum, tantalum nitride, tungsten nitride, nickel, or nickel boride, or may be formed of a double layer including titanium and titanium nitride. The metal film 63 may include various metals. As an embodiment, the metal film 63 may include copper. The barrier film 61 may surround a sidewall of the metal film 63.

Figure 3A:
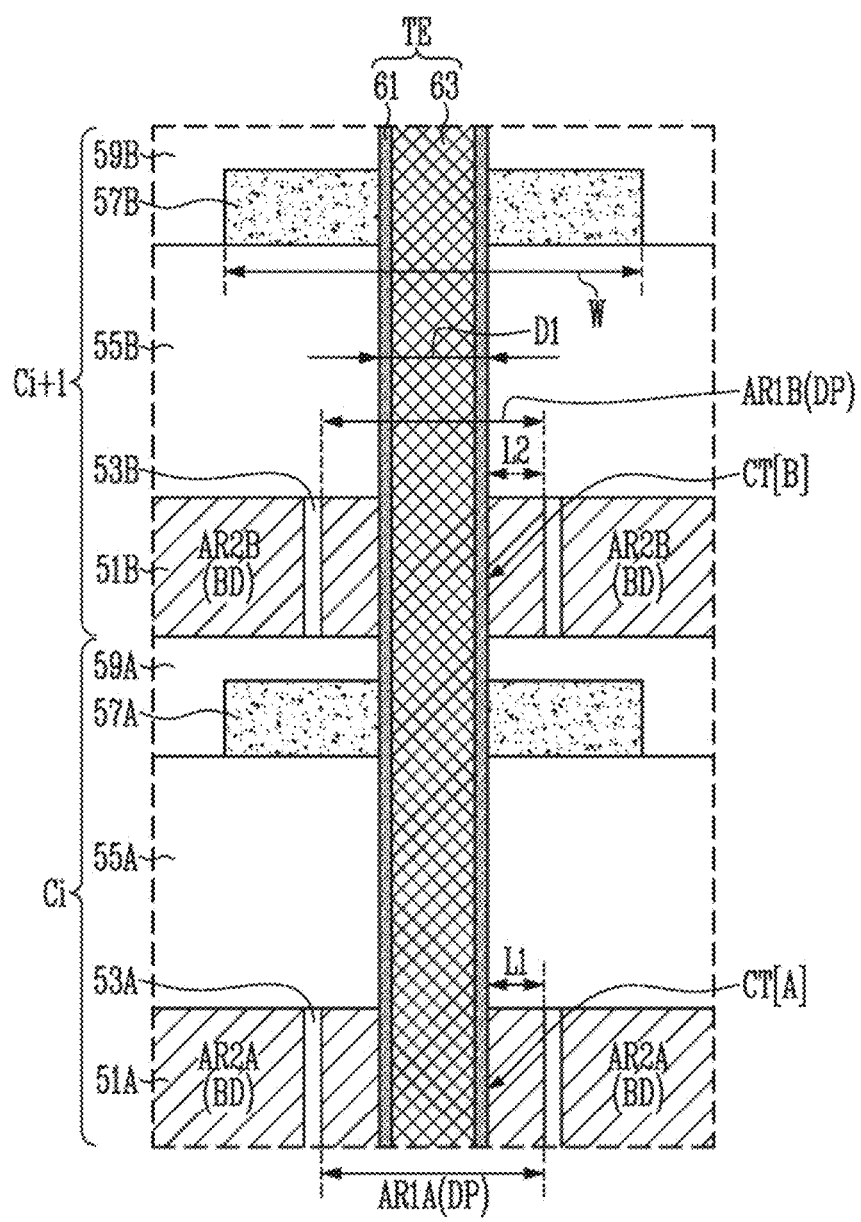
FIGS. 3A and 3B are enlarged views of a semiconductor device according to embodiments of the present disclosure.
Figure 3B:
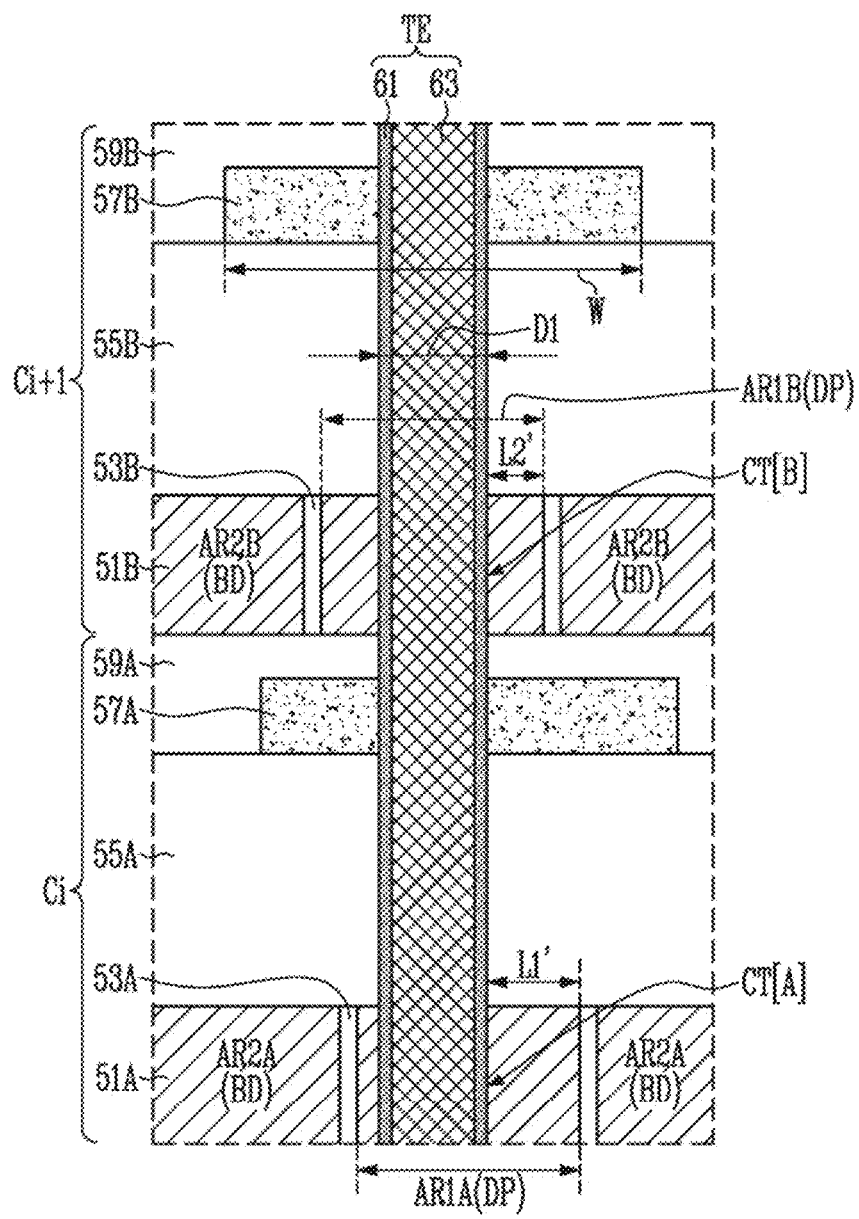

FIGS. 3A and 3B are enlarged views of a semiconductor device according to embodiments of the present disclosure. FIGS. 3A and 3B are cross-sectional views illustrating embodiments of a stack structure of semiconductor chips Ci and Ci+1 penetrated by the through electrode TE shown in FIG. 2.

Referring to FIGS. 3A and 3B, the semiconductor device may include a plurality of semiconductor chips stacked to overlap each other. Each of the semiconductor chips may include a substrate, an interlayer insulating structure, a conductive pad, and an upper insulating film, which are sequentially stacked.

As an embodiment, the semiconductor device may include a first semiconductor chip Ci (i is a natural number equal to or greater than 1) and a second semiconductor chip Ci+1 overlapping the first semiconductor chip Ci. The first semiconductor chip Ci may include a first substrate 51A, a first interlayer insulating structure 55A, a first conductive pad 57A, and a first upper insulating film 59A, which are sequentially stacked. The second semiconductor chip Ci+1 may include a second substrate 51B, a second interlayer insulating structure 55B, a second conductive pad 57B, and a second upper insulating film 59B, which are sequentially stacked.

The through electrode TE may extend to pass through not only the first substrate 51A, the first interlayer insulating structure 55A, the first conductive pad 57A, and the first upper insulating film 59A of the first semiconductor chip Ci, but also the second substrate 51B, the second interlayer insulating structure 55B, the second conductive pad 57B, and the second upper insulating film 59B of the second semiconductor chip Ci+1. The through electrode TE may include the barrier film 61 and the metal film 63 as described with reference to FIG. 2.

The first substrate 51A and the second substrate 51B may be penetrated by the first vertical insulating film 53A and the second vertical insulating film 53B, respectively. Each of the first vertical insulating film 53A and the second vertical insulating film 53B may correspond to the vertical insulating film 53 described with reference to FIG. 2. Specifically, the first vertical insulating film 53A may be disposed between a first area AR1A and a second area AR2A of the first substrate 51A and surround the first area AR1A. The second vertical insulating film 53B may be disposed between a first area AR1B and a second area AR2B of the second substrate 51B and surround the first area AR1B. As described with reference to FIG. 2, the first vertical insulating film 53A and the second vertical insulating film 53B may separate the first areas AR1A and AR1B remaining as the dummy patterns DP from the second areas AR2A and AR2B that is the body patterns BD. Because the first area AR1A of the first substrate 51A and the first area AR1B of the second substrate 51B overlap each other in the vertical direction, each through electrode TE extending in the vertical direction may pass through not only the first area AR1A of the first substrate 51A but also the first area AR1B of the second substrate 51B. In order to increase the alignment margin of the through electrode TE, an outer diameter of each of the first area AR1A of the first substrate 51A and the first area AR1B of the second substrate 51B may be defined to be greater than the diameter Di of the through electrode TE. The through electrode TE may be in contact with the first areas AR1A and AR1B remaining as the dummy patterns DP.

The first vertical insulating film 53A may be spaced apart from a first contact surface CT[A] between the first area AR1A of the first substrate 51A and the through electrode TE, and the second vertical insulating film 53B may be spaced apart from a second contact surface CT[B] between the first area AR1B of the second substrate 51B and the through electrode TE.

As an embodiment, as shown in FIG. 3A, the first vertical insulating film 53A may be vertically aligned to be overlapped by the second vertical insulating film 53B. A distance L1 between the first contact surface CT[A] and the first vertical insulating film 53A may be substantially the same as a distance L2 between the second contact surface CT[B] and the second vertical insulating film 53B.

As another embodiment, as shown in FIG. 3B, the first vertical insulating film 53A and the second vertical insulating film 53B may be vertically misaligned in a process of stacking the plurality of semiconductor chips C1 to Cn shown in FIG. 1 so that the first vertical insulating film 53A is not overlapped by the second vertical insulating film 53B. A distance L1' between the first contact surface CT[A] and the first vertical insulating film 53A may be different from a distance L2' between the second contact surface CT[B] and the second vertical insulating film 53B.

The first area AR1A defined by the first vertical insulating film 53A and the first area AR1B defined by the second vertical insulating film 53B has an area wider than that of the through electrode TE in consideration of the alignment margin of the through electrode TE. Accordingly, even though the first vertical insulating film 53A and the second vertical insulating film 53B are misaligned, the through electrode TE passing through the first areas AR1A and AR1B may be insulated from the second areas AR2A and AR2B without deviating from a boundary between the first area AR1A and the first vertical insulating film 53A and a boundary between the first area AR1B and the second vertical insulating film 53B.

Referring to FIGS. 3A and 3B again, each of the first interlayer insulating structure 55A and the second interlayer insulating structure 55B may include insulating films of multiple layers. Although not shown in the drawing, an integrated circuit configuring at least one of a memory cell array and a peripheral circuit for controlling the memory cell array may be formed on the body patterns BD of the first substrate 51A and the second substrate 51B. Each of the first interlayer insulating structure 55A and the second interlayer insulating structure 55B may be extended to cover the integrated circuit.

The first conductive pad 57A may be formed on the first interlayer insulating structure 55A and overlap the first area AR1A of the first substrate 51A. The second conductive pad 57B may be formed on the second interlayer insulating structure 55B and overlap the first area AR1B of the second substrate 51B. Each of the first conductive pad 57A and the second conductive pad 57B may contact the through electrode TE. In order to increase the alignment margin of the through electrode TE, a width W of each of the first conductive pad 57A and the second conductive pad 57B may be greater than the diameter D1 of the through electrode TE. The first conductive pad 57A and the second conductive pad 57B may electrically connect the first semiconductor chip Ci and the second semiconductor chip Ci+1 to an external circuit via the through electrode TE. The first conductive pad 57A and the second conductive pad 57B may be formed of various conductive materials. As an embodiment, the first conductive pad 57A and the second conductive pad 57B may include aluminum.

The first upper insulating film 59A may be disposed on the first interlayer insulating structure 55A to cover the first conductive pad 57A, and the second upper insulating film 59B may be disposed on the second interlayer insulating structure 55B to cover the second conductive pad 57B.

According to embodiments of the present disclosure, as described with reference to FIGS. 2, 3A, and 3B, the first area AR1, AR1A, or AR1B of the substrate 51, 51A, or 51B may be separated from the second area AR2, AR2A, or AR2B of the substrate 51, 51A, or 51B through the vertical insulating film 53, 53A, or 53B. Therefore, even though the through electrode TE is in contact with the first area AR1, AR1A, or AR1B, the through electrode TE may be insulated from the second area AR2, AR2A, or AR2B.

According to embodiments of the present disclosure, the outer diameter of the first area AR1, AR1A, or AR1B of the substrates 51, 51A, or 51B is controlled to be greater than the diameter D1 of the through electrode TE so that the alignment margin of the through electrode TE may be increased. Therefore, stability of a manufacturing process of the semiconductor device may be improved.

In a process of stacking the plurality of semiconductor chips C1 to Cn shown in FIG. 1 through the through electrode TE, conductive pads (for example, 57A and 57B) of the plurality of semiconductor chips C1 to Cn may be misaligned, and the first areas (for example, AR1A and AR1B) of the plurality of semiconductor chips C1 to Cn may be misaligned. Therefore, a center axis of the through electrode TE may not coincide with a center axis of some of the conductive pads 57A and 57B and the first areas AR1A and AR1B. Because the conductive pads 57A and 57B and the first areas AR1A and AR1B are formed to be wider than the through electrode TE, even though the center axis of the through electrode TE does not coincide with the center axis of some of the conductive pads 57A and 57B and the first areas AR1A and AR1B, the sidewall of the through electrode TE may contact the conductive pads 57A and 57B and the first areas AR1A and AR1B and may be surrounded by the conductive pads 57A and 57B and the first areas AR1A and AR1B.

Figure 4:
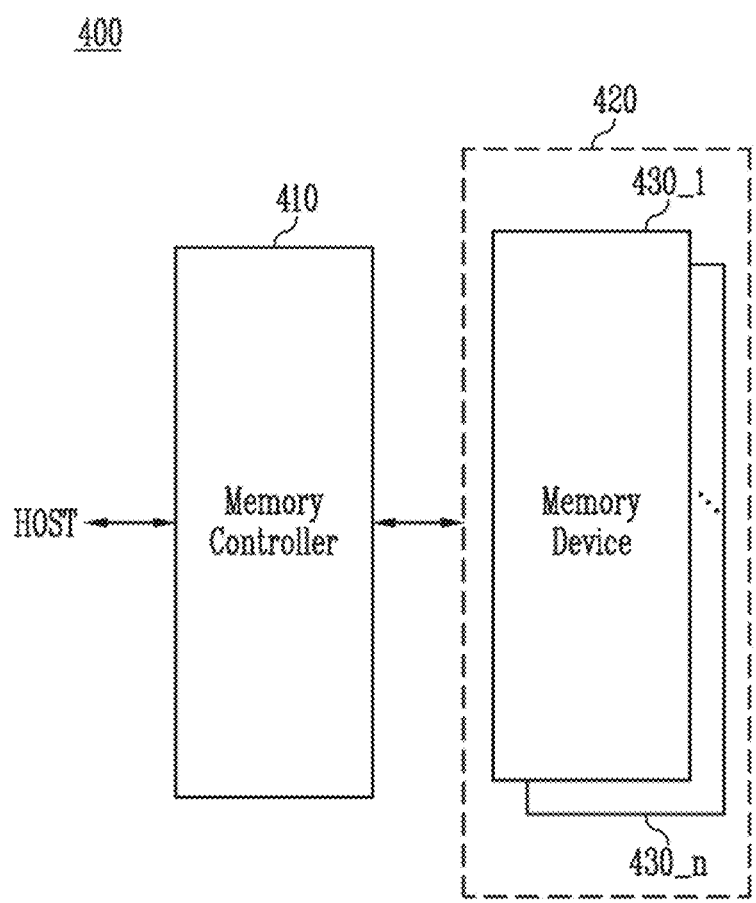
FIG. 4 is a block diagram illustrating a memory system according to an embodiment of the present disclosure.

FIG. 4 is a block diagram illustrating a memory system 400 according to an embodiment of the present disclosure.

Referring to FIG. 4, the memory system 400 may be applied to an electronic device such as a computer, a digital camera, and a smartphone and may process data.

The memory system 400 may include a memory controller 410 and a stacked memory device 420.

The memory controller 410 may transmit data to the stacked memory device 420 or provide a control signal according to an access request from a host HOST. The memory controller 410 may detect an error from the data read from the stacked memory device 420 and correct the detected error.

The stacked memory device 420 may include two or more memory chips 430_1 to 430_n stacked over each other. Each of the memory chips 430_1 to 430_n may include volatile memory or non-volatile memory. For example, each of the memory chips 430_1 to 430_n may include dynamic random access memory (DRAM), read-only memory (ROM), mask ROM (MROM), programmable ROM (PROM), erasable programmable ROM (EPROM), electrically erasable programmable ROM (EEPROM), NAND flash memory, NOR flash memory, phase change random access memory (PRAM), magnetic RAM (MRAM), resistive RAM (RRAM), ferroelectric RAM (FRAM), or the like.

The memory chips 430_1 to 430_n may be penetrated by the through electrode TE described with reference to FIGS.

3A and 3B. Substrates of the memory chips 430_1 to 430_n may be penetrated by the vertical insulating films 53A and 53B described with reference to FIGS. 3A and 3B.

Figure 5:
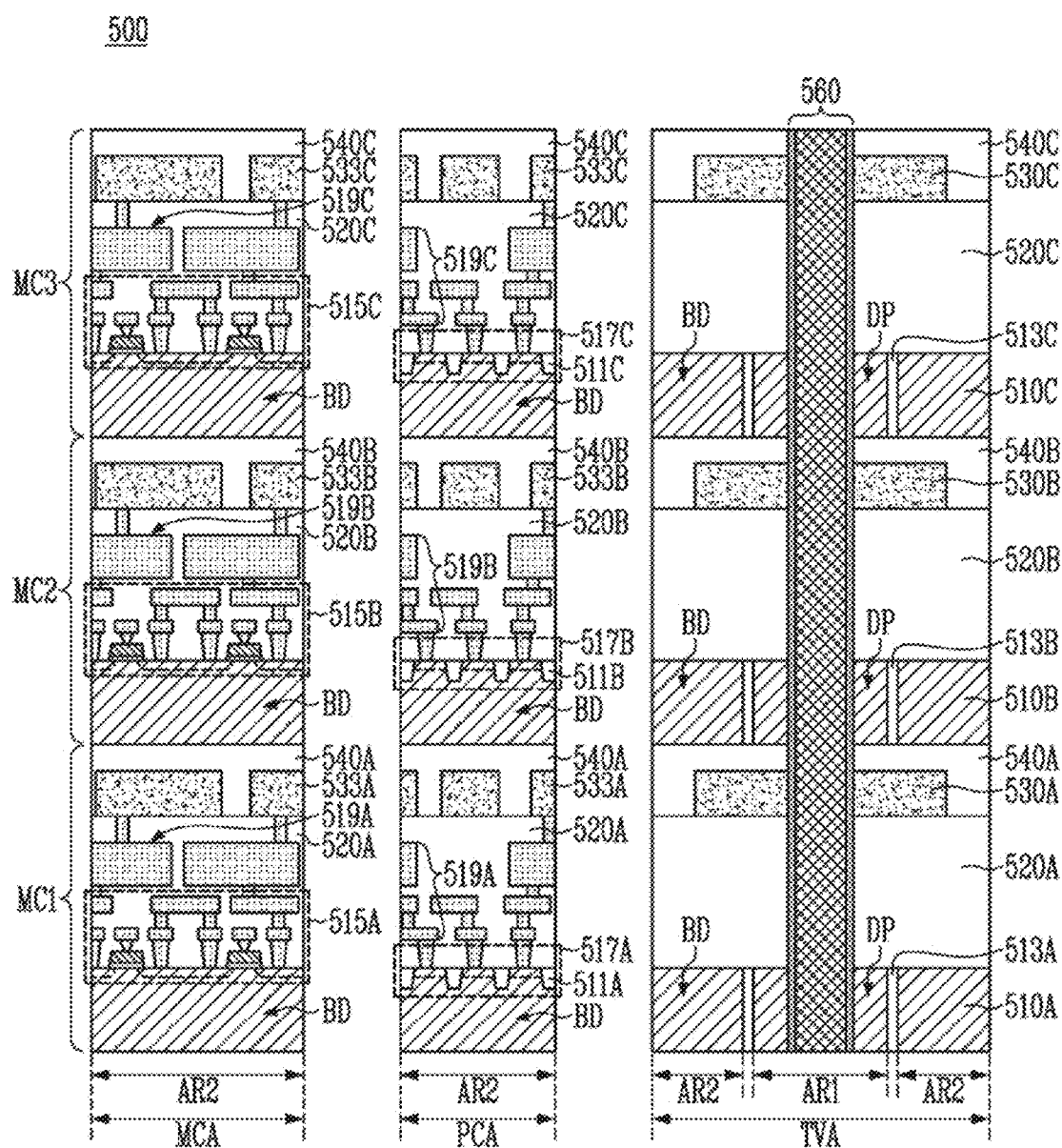
FIG. 5 is a cross-sectional view illustrating a stacked memory device according to an embodiment of the present disclosure.

FIG. 5 is a cross-sectional view illustrating a stacked memory device 500 according to an embodiment of the present disclosure. FIG. 5 illustrates cross-sections for a memory cell array area MCA, a peripheral circuit area PCA, and a through via area TVA.

Referring to FIG. 5, the stacked memory device 500 includes three memory chips MC1, MC2, and MC3 overlapping each other. In other embodiments, a stacked memory device may include two or more than three memory chips. As an embodiment, the stacked memory device 500 may include a first memory chip MC1, a second memory chip MC2, and a third memory chip MC3, which are sequentially stacked.

Each of the first memory chip MC1, the second memory chip MC2, and the third memory chip MC3 may include a substrate 510A, 510B, or 510C, an interlayer insulating structure 520A, 520B, or 520C, a conductive pad 530A, 530B, or 530C, and an upper insulating film 540A, 540B, or 540C, which are sequentially stacked. The substrate 510A, 510B, or 510C may be divided into a first area AR1 and a second area AR2 by a vertical insulating film 513A, 513B, or 513C. The first area AR1 may be penetrated by a through electrode 560 and may remain as a dummy pattern DP contacting the through electrode 560.

The second area AR2 may extend from the through via area TVA to the peripheral circuit area PCA and the memory cell array area MCA. The second area AR2 may be used as a body pattern BD doped with various impurities for a well structure and a channel. Isolation insulating films 511A, 511B, or 511C may be embedded in the body pattern BD.

Each of the first memory chip MC1, the second memory chip MC2, and the third memory chip MC3 may include a memory cell array 515A, 515B, or 515C and a peripheral circuit 517A, 517B, or 517C formed on the body pattern BD of the substrate 510A, 510B, or 510C. The memory cell array 515A, 515B, or 515C may be disposed in the memory cell array area MCA, and the peripheral circuit 517A, 517B, or 517C may be disposed in the peripheral circuit area PCA. FIG. 5 illustrates an embodiment in which the memory cell array 515A, 515B, or 515C includes a DRAM cell, however, the present disclosure is not limited thereto.

The interlayer insulating structure 520A, 520B, or 520C may be extended on the body pattern BD so as to cover the memory cell array 515A, 515B, or 515C and the peripheral circuit 517A, 517B, or 517C.

Interconnection structures 519A, 519B, or 519C electrically connected to the memory cell array 515A, 515B, or 515C and the peripheral circuit 517A, 517B, or 517C may be embedded in the interlayer insulating structure 520A, 520B, or 520C. Each of the interconnection structures 519A, 519B, or 519C may include at least one of a pad pattern, a contact plug, and a connection wire, The interconnection structures 519A, 519B, or 519C may be electrically connected to upper pad patterns 533A, 533B, or 533C. The upper pad patterns 533A, 533B, or 533C may be disposed on the same level as the conductive pads 530A, 530B, or 530C. The upper pad patterns 533A, 533B, or 533C may be covered with the upper insulating film 540A, 540B, or 540C.

Figure 6:
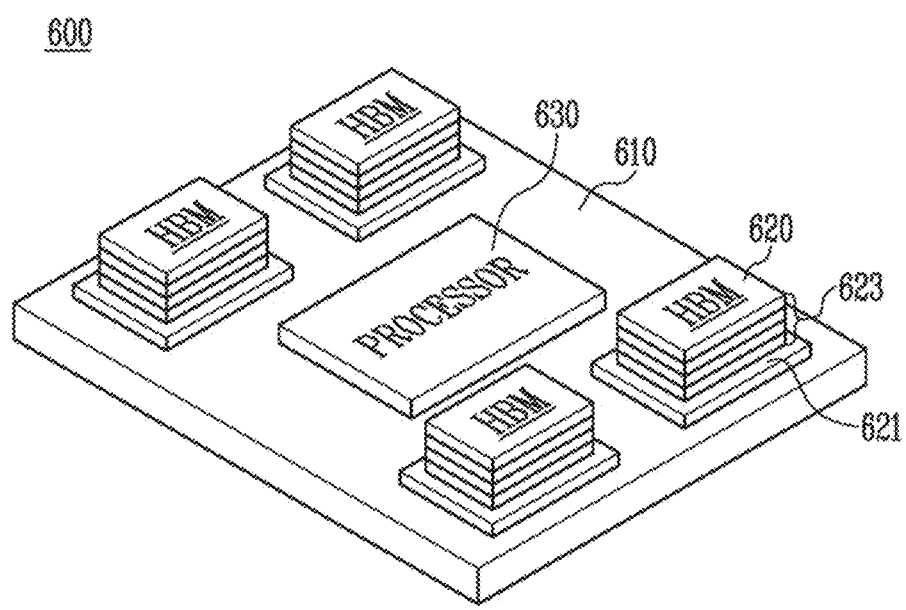
FIG. 6 is a diagram illustrating a memory system according to an embodiment of the present disclosure.

FIG. 6 is a diagram illustrating a memory system 600 according to an embodiment of the present disclosure.

Referring to FIG. 6, the memory system 600 may include a plurality of high bandwidth memory devices (HBMs) 620 and a processor 630 that are mounted on an interposer 610.

Each HBM 620 may be connected to the processor 630 through the interposer 610. Each HBM 620 may include an interface chip 621 disposed on the interposer 610 and memory chips 623 stacked on the interface chip 621, The memory chips 623 and the interface chip 621 may be electrically connected through a through electrode extending to pass through substrates of the memory chips 623 and a substrate of the interface chip 621 as described with reference to FIGS. 3A and 3B. The through electrode passing through the memory chips 623 and the interface chip 621 may pass through the first area of each of the substrates defined by the vertical insulating film and contact the first area as described with reference to FIGS. 3A and 3B, The interface chip 621 may provide an interface for communication between the processor 630 and the memory chips 623.

The processor 630 may include a memory controller for controlling each HBM 620. For example, the processor 630 may include a graphic processing unit (GPU) or a central processing unit (CPU) in which the memory controller is embedded.

Figure 7:
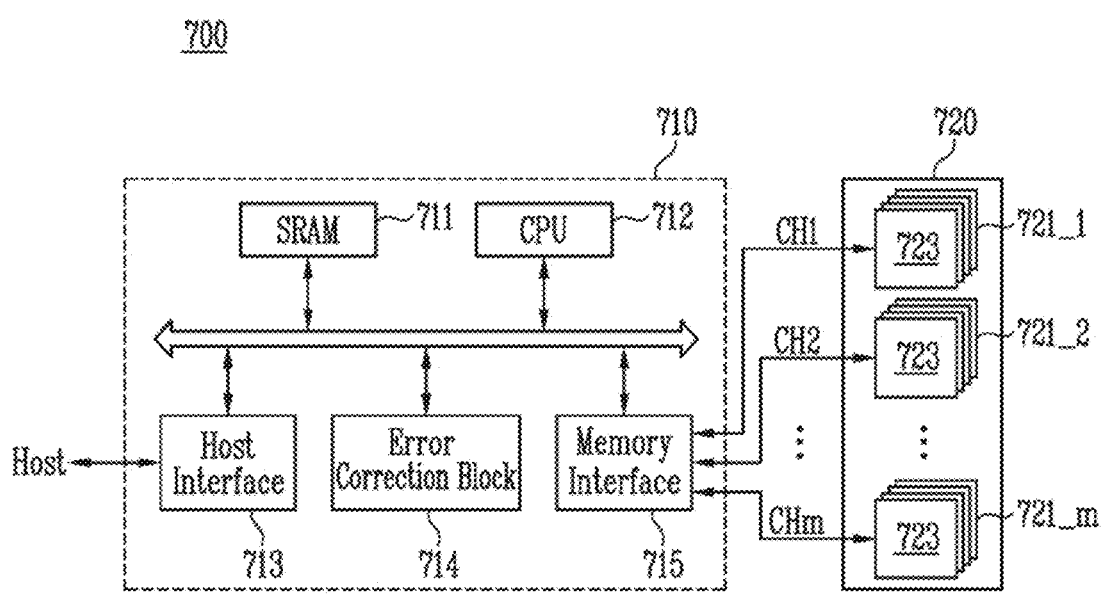
FIG. 7 is a block diagram illustrating a memory system according to an embodiment of the present disclosure.

FIG. 7 is a block diagram illustrating a memory system 700 according to an embodiment of the present disclosure.

Referring to FIG. 7, the memory system 700 may include a memory controller 710 and a stacked memory device 720.

The memory controller 710 may be configured to control the stacked memory device 720, and may include static random access memory (SRAM) 711, a central processing unit (CPU) 712, a host interface 713, an error correction block 714, and a memory interface 715. The SRAM 711 may be used as an operation memory of the CPU 712. The CPU 712 may perform various control operations for data exchange of the memory controller 710. The host interface 713 includes a data exchange protocol of a host Host connected to the memory system 700. The error correction block 714 detects an error included in data read from the stacked memory device 720 and corrects the detected error. The memory interface 715 performs interfacing with the stacked memory device 720. The memory controller 710 may further include read only memory (ROM) that stores code data for interfacing with the host Host.

The stacked memory device 720 may include a plurality of memory packages 721_1 to 721_m. Each of the memory packages 721_1 to 721_m may be formed as a structure in which a plurality of memory chips 723 are stacked. The memory chips 723 may be electrically connected through a through electrode extending to pass through substrates of the memory chips 723 as described with reference to FIGS. 3A and 3B. The through electrode may pass through the first areas of the substrates defined by the vertical insulating films and contact the first areas of the substrates as described with reference to FIGS. 3A and 313.

A plurality of channels CH1 to CHm may be provided to the memory controller 710 and the stacked memory device 720. A memory package corresponding to each of the channels CH1 to CHm may be electrically connected to corresponding one of the channels CH1 to CHm. Each of the channels CH1 to CHm may be electrically connected to a memory package corresponding thereto through a through electrode passing through the memory chips 723.

The above-described memory system 700 may be a memory card or a solid state drive (SSD) in which the stacked memory device 720 and the memory controller 710 are combined. As an embodiment, when the memory system 700 is the SSD, the memory controller 710 may communicate with the outside (for example, a host) through one of various interface protocols such as a universal serial bus (USB), multi-media card (MMC), a peripheral component interconnection-express (PCI-E), a serial advanced technology attachment (SATA), a parallel advanced technology attachment (DATA), a small computer small interface (SCSI), an enhanced small disk interface (ESDI), and integrated drive electronics (IDE).

Figure 8:
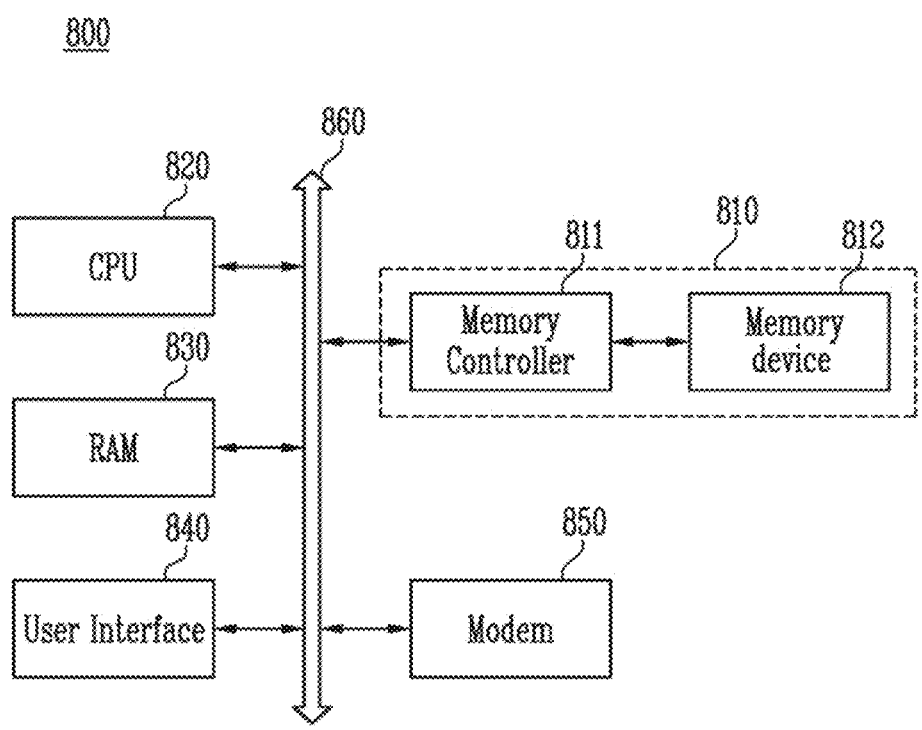
FIG. 8 is a block diagram illustrating a configuration of a computing system according to an embodiment of the present disclosure.

FIG. 8 is a block diagram illustrating a configuration of a computing system 800 according to an embodiment of the present disclosure.

Referring to FIG. 8, the computing system 800 may include a CPU 820 electrically connected to a system bus 860, a random access memory (RAM) 830, a user interface 840, a modem 850, and a memory system 810. When the computing system 800 is a mobile device, a battery for supplying an operation voltage to the computing system 800 may be further included, an application chipset, an image processor, and a mobile DRAM may be further included.

The memory system 810 may include a memory controller 811 and a memory device 812. The memory device 812 may be configured of a stacked memory device in which a plurality of memory chips are o stacked, as described with reference to FIG. 7, and the plurality of memory chips may be penetrated by a through electrode.

Figure 9:
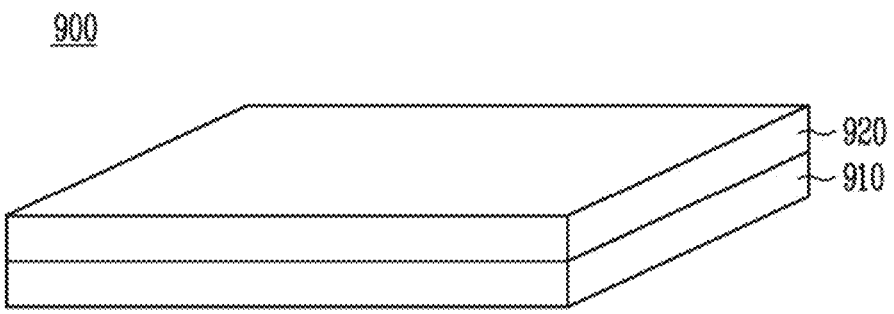
FIG. 9 is a diagram illustrating a CMOS image sensor according to an embodiment of the present disclosure.

FIG. 9 is a diagram illustrating a CMOS image sensor (CIS) 900 according to an embodiment of the present disclosure.

Referring to FIG. 9, the CIS 900 may include a logic chip 910 and a pixel chip 920 stacked on the logic chip 910.

The logic chip 910 may include a peripheral circuit for processing pixel signals from the pixel chip 920. The peripheral circuit may include a row driver, a correlated double sampler (CDS), an analog-to-digital converter (ADC), a timing controller, and the like.

The pixel chip 920 may include a pixel array. The pixel array may convert incident light to generate an electrical pixel signal. The pixel array may include a plurality of unit pixels disposed in a matrix form. The pixel array may be driven by driving signals provided from the logic chip 910.

The logic chip 910 and the pixel chip 920 may be penetrated by a through electrode and electrically connected through the through electrode. Each of a substrate of the logic chip 910 and a substrate of the pixel chip 920 may include a first area defined by a vertical insulating film as described with reference to FIGS. 3A and 3B. A first area of each of the substrate of the logic chip 910 and the substrate of the pixel chip 920 may be penetrated by the through electrode and contact the through electrode as described with reference to FIGS. 3A and 3B.

FIGS. 10A, 10B, 10C, 11, 12A, and 12B are cross-sectional views illustrating a method of manufacturing a semiconductor device according to an embodiment of the present disclosure. FIGS. 10A, 10B, 10C, 11, 12A, and 12B illustrate a stacked memory device as a semiconductor device, but embodiments of the present disclosure are not limited thereto. FIGS. 10A, 10B, 10C, 11, 12A, and 12B illustrate cross-sections for the memory cell array area MCA, the peripheral circuit area PCA, and the through via area TVA.

Figure 10A:
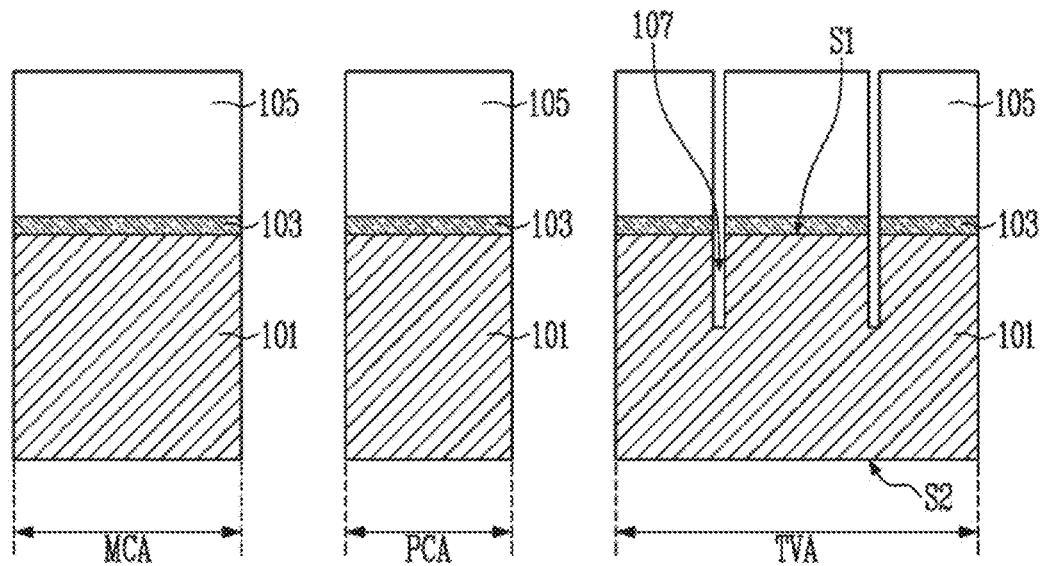
FIGS. 10A, 10B, 10C, 11, 12A, and 12B are cross-sectional views illustrating a method of manufacturing a semiconductor device according to an embodiment of the present disclosure.
Figure 10B:
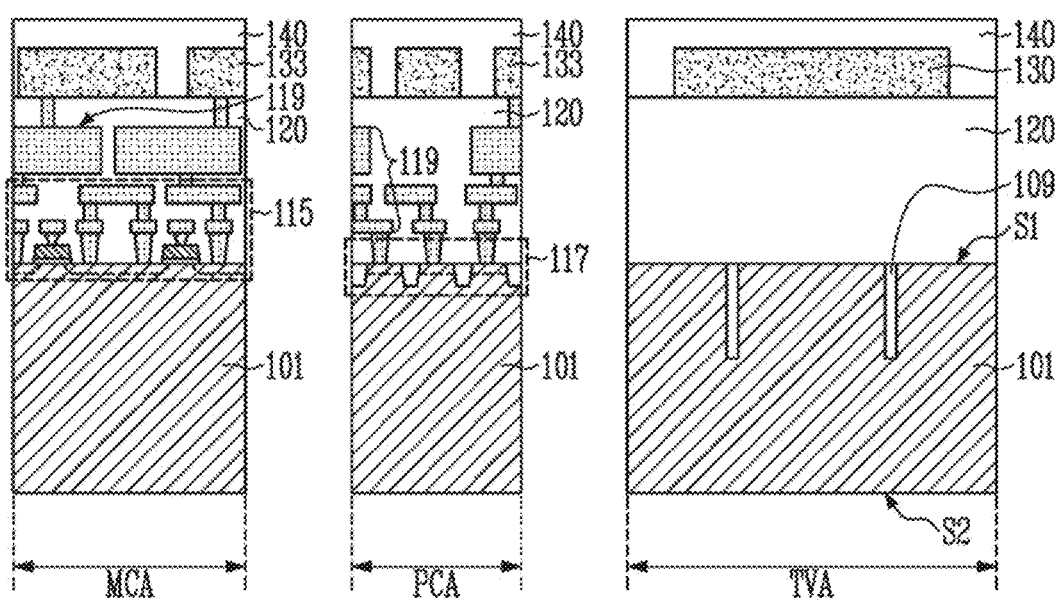
Figure 10C:
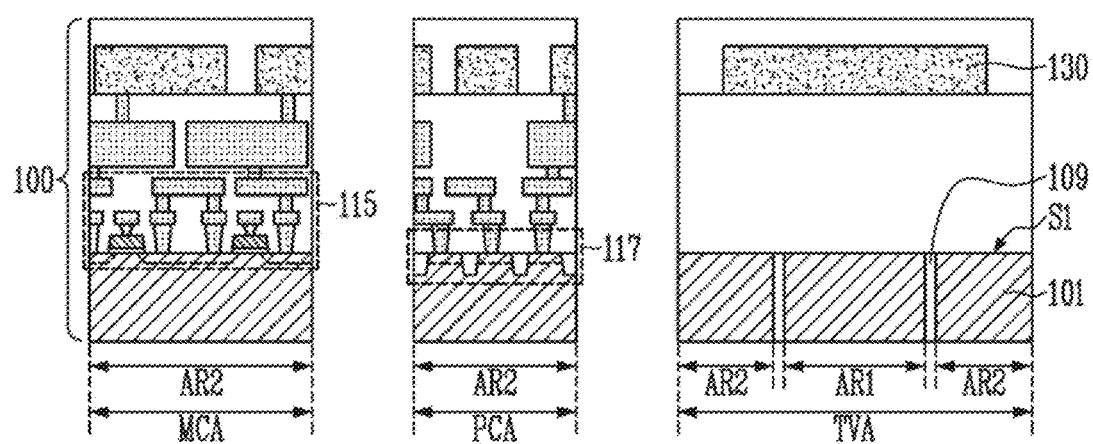

FIGS. 10A to 10C are cross-sectional views illustrating an embodiment of a method of manufacturing a semiconductor chip, and cross-sectional views illustrating an embodiment of a method of manufacturing a memory chip as an embodiment of a semiconductor chip.

Referring to FIG. 10A, a protective film 103 may be formed on a first surface S1 of a substrate 101 having the first surface S1 and a second surface S2 opposite to the first surface S1. The substrate 101 may be a semiconductor substrate of silicon, germanium, gallium arsenide, or the like. The protective film 103 may include a nitride film.

Subsequently, a mask pattern 105 may be formed on the protective film 103. The mask pattern 105 may be a photoresist pattern formed through a photolithography process. The protective film 103 may be etched by an etching process using the mask pattern 105 as an etching barrier, and the substrate 101 exposed through an etching area of the protective film 103 may be etched. Therefore, a trench 107 extending from the first surface S1 of the substrate 101 to inside of the substrate 101 may be formed. A lower surface of the trench 107 may be positioned at a distance spaced apart from the second surface S2 of the substrate 101. The trench 107 may be formed in the through via area TVA.

Referring to FIG. 10B, the mask pattern 105 shown in FIG. 10A may be removed, and the trench 107 shown in FIG. 10A may be filled with an insulating material. Thereafter, the insulating material may be planarized so that the protective film 103 shown in FIG. 10A is exposed. Therefore, a vertical insulating film 109 may be formed inside the trench 107 shown in FIG. 10A. Thereafter, the protective film 103 shown in FIG. 10A may be removed.

The vertical insulating film 109 may include oxide. The vertical insulating film 109 may extend from the first surface S1 of the substrate 101 to the inside of the substrate 101 in the through via area TVA.

Subsequently, processes for forming a memory cell array 115 and a peripheral circuit 117 on the first surface S1 of the substrate 101 in the memory cell array area MCA and the peripheral circuit area PCA may be performed. The processes for forming the memory cell array 115 and the peripheral circuit 117 may include a process of injecting at least one of an n-type impurity and a p-type impurity into the substrate 101 of the memory cell array area MCA and the peripheral circuit area PCA, a process of forming an isolation insulating film for defining active regions of the substrate 101, a process of patterning gate electrodes, and the like.

Thereafter, interconnection structures 119 connected to the memory cell array 115 and the peripheral circuit 117 may be formed, and an interlayer insulating structure 120 may be formed on the first surface S1 of the substrate 101. The interlayer insulating structure 120 may be extended to cover the vertical insulating film 109. The interlayer insulating structure 120 may include insulating films of multiple layers.

Forming the insulating films of the multiple layers included in the interlayer insulating structure 120, forming the memory cell array 115, forming the peripheral circuit 117, and forming the interconnection structures 119 may be performed by various methods.

Subsequently, a conductive pad 130 and upper pad patterns 133 may be formed on the interlayer insulating structure 120. The conductive pad 130 and the upper pad patterns 133 may be formed by etching a metal film. As an embodiment, the metal film may include aluminum.

The conductive pad 130 is formed to overlap the vertical insulating film 109. Although not shown in the drawing, the upper pad patterns 133 may be extended to connect with the interconnection structures 119.

Referring to FIG. 10C, a portion of the substrate 101 may be removed to expose the vertical insulating film 109 from the second surface S2 shown in FIG. 10B. A process of removing a portion of the substrate 101 may be performed by grinding.

As a portion of the substrate 101 is removed, the substrate 101 may be separated into a first area AR1 and a second area AR2 by the vertical insulating film 109. The first area AR1 may overlap the conductive pad 130, and the second area AR2 may support the memory cell array 115 and the peripheral circuit 117. The vertical insulating film 109 may be formed to surround the first area AR1 as described with reference to FIG. 2.

The memory chip 100 may be provided using the processes described above with reference to FIGS. 10A to 10C.

Figure 11:
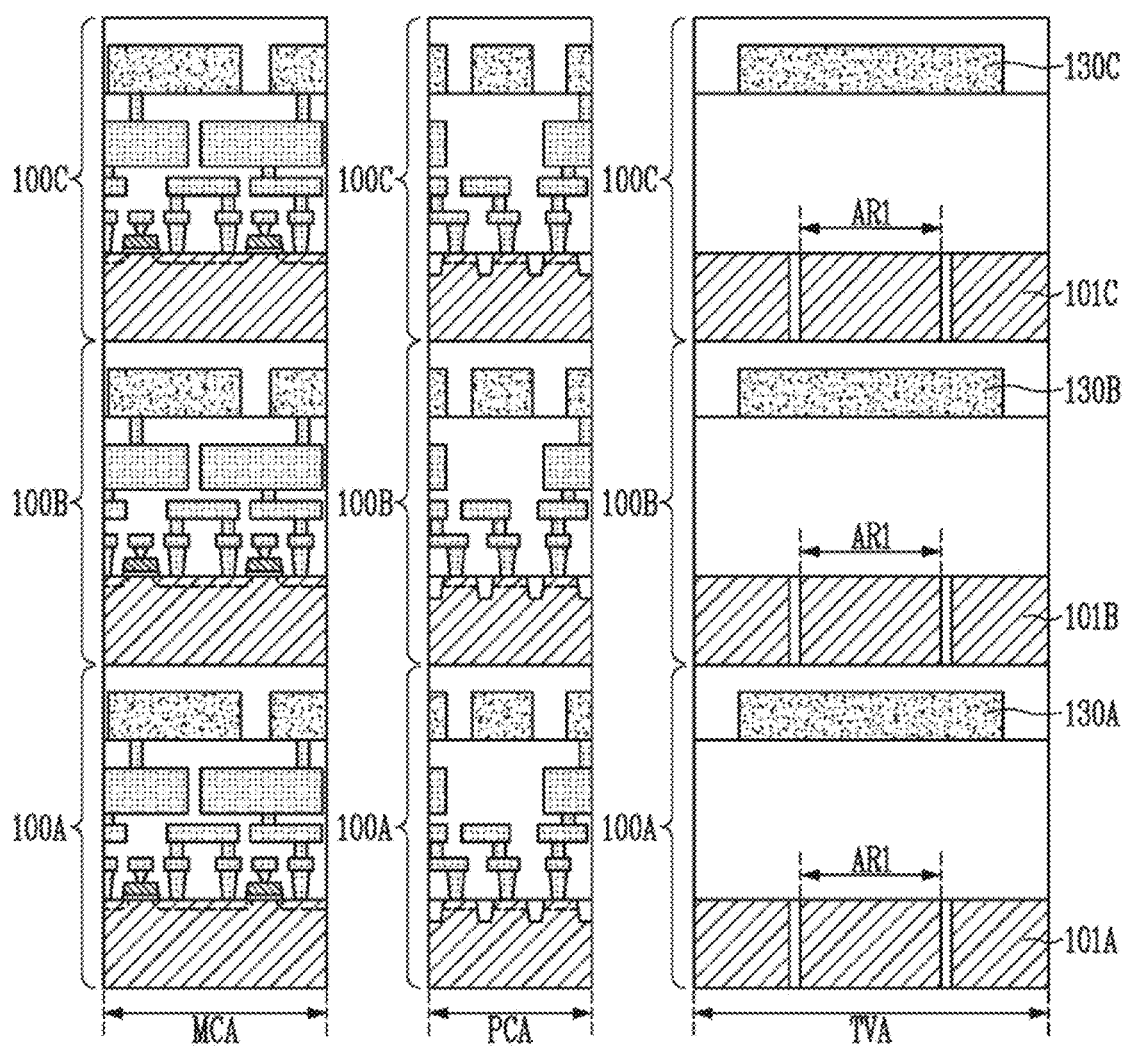

FIG. 11 illustrates stacking a plurality of memory chips 100A, 100B, and 100C after forming a plurality of memory chips 100A, 100B, and 100C using the processes described above with reference to FIGS. 10A to 10C.

Referring to FIG. 11, the memory chips 100A, 100B, and 100C are stacked so that first areas AR1 of substrates 101A, 101B, and 101C overlap each other. According to a stacked structure of the memory chips 100A, 1008, and 100C, conductive pads 130A, 130B, and 130C of the memory chips 100A, 100B, and 100C disposed in the through via area TVA may overlap each other. The stacked structure of the plurality of memory chips 100A, 100B, and 100C is not limited to a three-layer structure as shown in FIG. 11 and may be variously changed to include different numbers of layers. As an embodiment, the stacked structure of the plurality of memory chips 100A, 100B, and 100C may be an eight-layer structure.

Figure 12A:
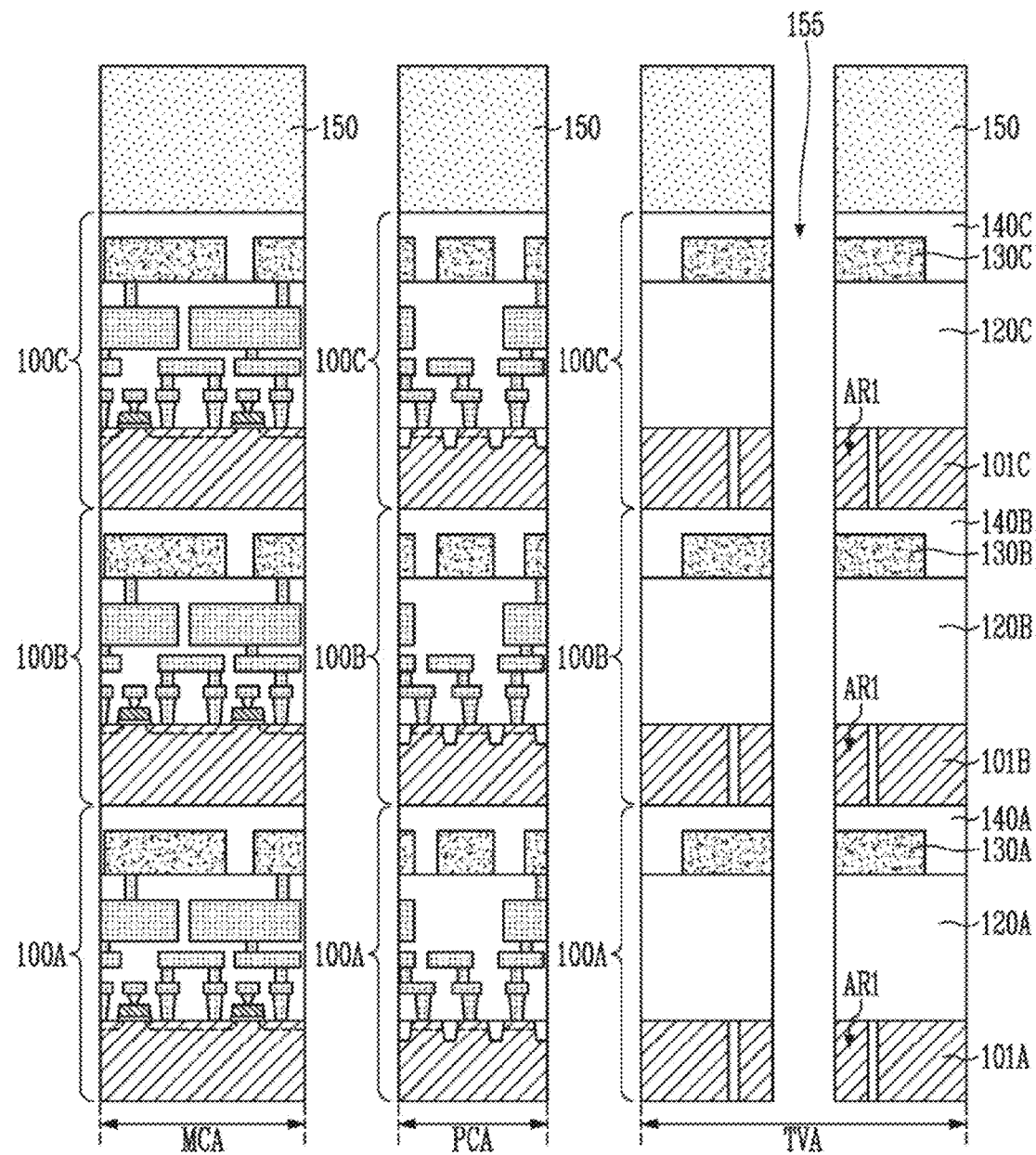
Figure 12B:
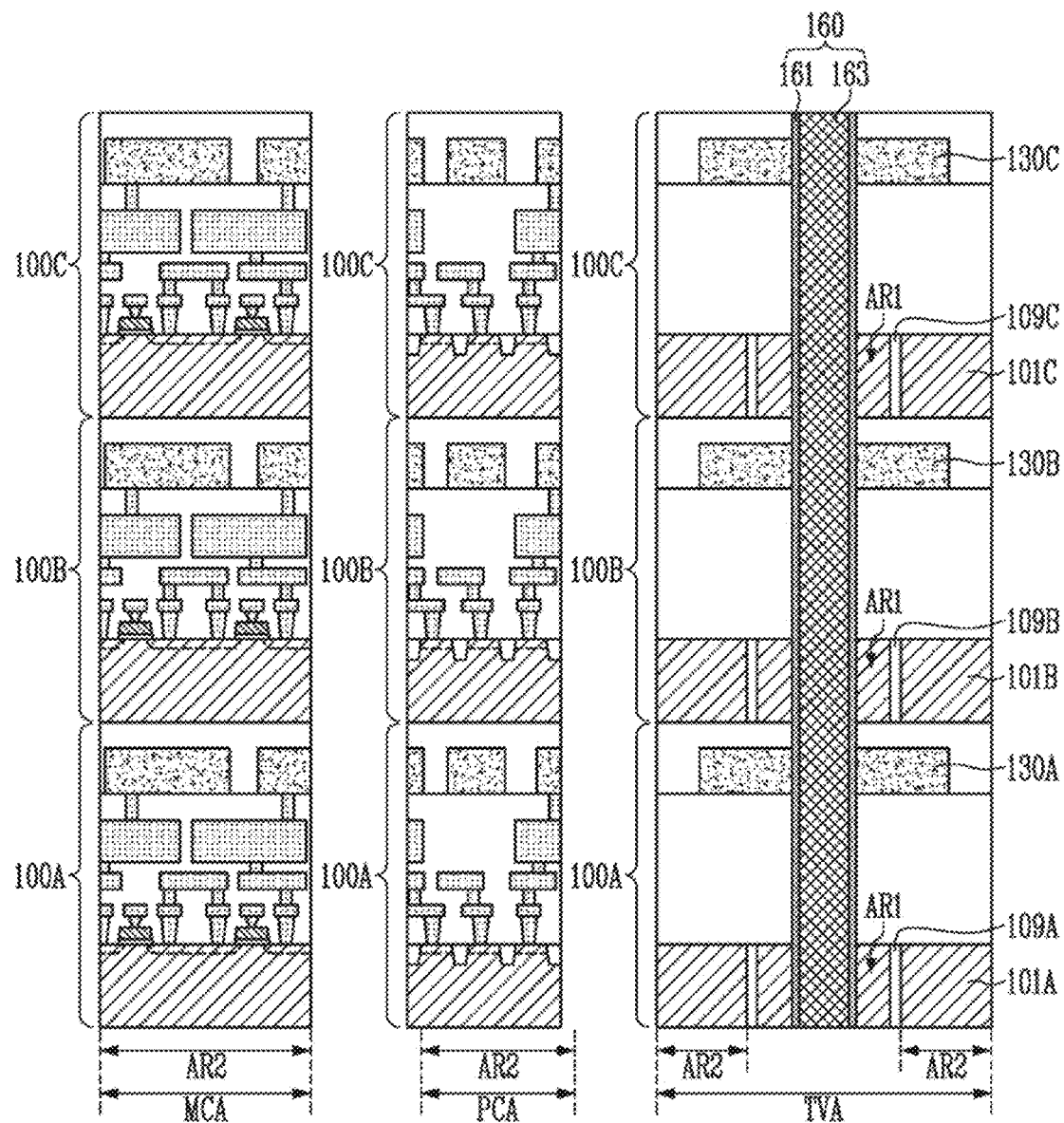

FIGS. 12A and 12B are cross-sectional views illustrating a process of forming a through electrode 160.

Referring to FIG. 12A, a mask pattern 150 may be formed on a plurality of memory chips 100A, 100B, and 100C stacked to overlap each other. The mask pattern 150 may be a photoresist pattern formed through a photolithography process.

The first areas AR1 of the substrates 101A, 101B, and 101C disposed in the through via area TVA of the memory chips 100A, 100B, and 100C, the interlayer insulating structures 120A, 120B, and 120C, the conductive pads 130A, 130B, and 130C, and the upper insulating films 140A, 140B, and 140C may be etched by an etching process using the mask pattern 150 as an etching barrier. Therefore, a hole 155 passing through the memory chips 100A, 100B, and 100C may be formed.

Because a thickness of each of the substrates 101A, 1018, and 1010 is reduced through the grinding process described with reference to FIG. 10C, the etching process for forming the hole 155 is facilitated.

A width of the hole 155 is formed to be narrower than a width of each of the conductive pads 130A, 130B, and 130C and a width of each of the first areas AR1 of the substrates 101A, 101B, and 101C.

Referring to FIG. 12B, after removing the mask pattern 150 shown in FIG. 12A, the hole 155 shown in FIG. 12A may be filled with the through electrode 160.

The through electrode 160 may include a barrier film 161 and a metal film 163 as described with reference to FIG. 2. The through electrode 160 may contact the first areas AR1 of the substrates 101A, 101B, and 101C and the conductive pads 130A, 130B, and 130C.

Before forming the through electrode 160 and the hole 155 shown in FIG. 12A, because the first areas AR1 are separated from the o second areas AR2 of the substrates 101A, 101B, and 101C by the vertical insulating films 109A, 109B, and 109C, the through electrode 160 may be insulated from the second areas AR2 by the vertical insulating films 109A, 109B, and 109C. Therefore, the through electrode 160 contacting the conductive pads 130A, 130B, and 130C and the first areas AR1 may be formed in a simplified process without performing a process of forming an insulating film on a sidewall of the first areas AR1.

In the present disclosure, terms such as first, second, and the like used to describe components are used for the purpose of distinguishing one component from other components, and the components are not limited by the terms. For example, a first component may be referred to as a second component, and similarly, a second component may also be referred to as a first component without departing from the scope of rights according to the concept of the present disclosure.

The present disclosure separates a first area and a second area of a substrate through a vertical insulating film, forms a conductive pad of a semiconductor chip, and then forms a through electrode passing through the first area of the substrate and the conductive pad of the semiconductor chip. According to the present disclosure, even though the through electrode contacts the first area of the substrate, the through electrode may be insulated from the second area of the substrate through the vertical insulating film. Accordingly, because the present disclosure may omit a structure for insulating the first area of the substrate and the through electrode from each other, the present disclosure may simplify a process of manufacturing a memory device.

The present disclosure may simplify the manufacturing process of a memory device by stacking a plurality of semiconductor chips and then forming the through electrode passing through the plurality of semiconductor chips.

What is claimed is:

1. A semiconductor device comprising:
    a substrate including a first area and a second area;
    a vertical insulating film passing through the substrate between the first area of the substrate and the second area of the substrate;
    an interlayer insulating structure disposed on the substrate;
    a conductive pad formed on the interlayer insulating structure and overlapping the first area of the substrate; and
    a through electrode passing through the conductive pad, the interlayer insulating structure, and the substrate in the first area,
    wherein a portion of the first area of the substrate remains between the through electrode and the vertical insulating film to contact the through electrode.

2. The semiconductor device of claim 1, wherein the vertical insulating film surrounds the first area of the substrate.

3. The semiconductor device of claim 2, wherein the vertical insulating film is formed in a shape of a closed curve or a polygon.

4. The semiconductor device of claim 1, wherein the first area of the substrate is separated from the second area of the substrate by the vertical insulating film.

5. The semiconductor device of claim 1, wherein a width of the conductive pad is greater than a diameter of the through electrode.

6. The semiconductor device of claim 1, wherein an outer diameter of the first area of the substrate is greater than a diameter of the through electrode.

7. A semiconductor device comprising:
    a first semiconductor chip including a first substrate, a first interlayer insulating structure, and a first conductive pad, which are sequentially stacked;
    a second semiconductor chip overlapping the first semiconductor chip, wherein the second semiconductor chip includes a second substrate, a second interlayer insulating structure, and a second conductive pad, which are sequentially stacked;

a through electrode passing through the first semiconductor chip and the second semiconductor chip and contacting the first conductive pad, the second conductive pad, the first substrate, and the second substrate;

a first vertical insulating film passing through the first substrate and spaced from a first contact surface between the first substrate and the through electrode; and a second vertical insulating film passing through the second substrate and spaced apart from a second contact surface between the second substrate and the through electrode.

8. The semiconductor device of claim 7, wherein:
the first substrate is separated into a first dummy pattern connected to the through electrode and a first body pattern insulated from the first dummy pattern by the first vertical insulating film; and
the second substrate is separated into a second dummy pattern connected to the through electrode and a second body pattern insulated from the second dummy pattern by the second vertical insulating film.

9. The semiconductor device of claim 8, wherein an outer diameter of each of the first dummy pattern and the second dummy pattern is greater than a diameter of the through electrode.

10. The semiconductor device of claim 8, wherein:
the first semiconductor chip further includes at least one of a first memory cell array and a first peripheral circuit that is formed on the first body pattern and covered by the first interlayer insulating structure; and
the second semiconductor chip further includes at least one of a second memory cell array and a second peripheral circuit that is formed on the second body pattern and covered by the second interlayer insulating structure.

11. The semiconductor device of claim 7, wherein a distance between the first contact surface and the first vertical insulating film is the same as a distance between the second contact surface and the second vertical insulating film.

12. The semiconductor device of claim 7, wherein a distance between the first contact surface and the first vertical insulating film is different from a distance between the second contact surface and the second vertical insulating film.

13. The semiconductor device of claim 7, wherein each of the first vertical insulating film and the second vertical insulating film is formed in a shape of a closed curve or a polygon.

14. The semiconductor device of claim 7, wherein a width of each of the first conductive pad and the second conductive pad is wider than a diameter of the through electrode.

* * * * *